United States Patent
Berzins

(10) Patent No.: US 10,262,723 B2
(45) Date of Patent: Apr. 16, 2019

(54) SYSTEM AND METHOD FOR IMPROVING SCAN HOLD-TIME VIOLATION AND LOW VOLTAGE OPERATION IN SEQUENTIAL CIRCUIT

(71) Applicant: Samsung Electronics Co., Ltd., Suwon-si, Gyeonggi-do (KR)

(72) Inventor: Matthew Berzins, Cedar Park, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/680,198

(22) Filed: Aug. 17, 2017

(65) Prior Publication Data
US 2018/0342287 A1 Nov. 29, 2018

Related U.S. Application Data

(60) Provisional application No. 62/511,321, filed on May 25, 2017.

(51) Int. Cl.
  *G11C 11/00* (2006.01)
  *G11C 11/417* (2006.01)
  *H03K 3/037* (2006.01)

(52) U.S. Cl.
  CPC ........ *G11C 11/417* (2013.01); *H03K 3/0372* (2013.01)

(58) Field of Classification Search
  CPC ........ G11C 7/22; G11C 7/222; G11C 7/1066; G11C 7/1072; G11C 7/1078; G11C 7/109; G11C 11/4096; G11C 7/1051; G11C 11/4076; G11C 2207/2254; G11C 7/04; G11C 7/10

USPC ...... 365/233.1, 222, 230.08, 185.21, 189.05, 365/189.12, 194, 219, 226, 233.11, 365/233.12, 51, 63
  See application file for complete search history.

(56) References Cited

U.S. PATENT DOCUMENTS

| | | |
|---|---|---|
| 5,461,331 A | 10/1995 | Schorn |
| 5,497,114 A | 3/1996 | Shimozono et al. |
| 5,784,384 A | 7/1998 | Maeno |

(Continued)

FOREIGN PATENT DOCUMENTS

KR   20080068364 A   7/2008

OTHER PUBLICATIONS

VLSI n EDA blog, "Setup Time and hold time basics," webpage (http://vlsiuniverse.blogspot.com/2013/06/setup-and-hold-basics-of-timing-analysis.html), retrieved Jun. 17, 2017, 6 pages.

*Primary Examiner* — Thong Q Le
(74) *Attorney, Agent, or Firm* — Renaissance IP Law Group LLP

(57) ABSTRACT

According to one general aspect, an apparatus may include a flip-flop circuit. The flip-flop circuit may include a selection circuit, a memory element circuit, a clock circuit. The selection circuit to select, as the selected input signal, between at least two input signals. The memory element circuit synchronously controlled by a clock signal, and configured to store the selected input signal. The clock circuit configured to output, at least, an earlier version of the clock signal and a later version of the clock signal. The selection circuit is configured to be synchronously controlled, at least in part, by the earlier version of the clock signal such that the selected input signal is held stable when being read by the memory element circuit.

20 Claims, 7 Drawing Sheets

(56) References Cited

U.S. PATENT DOCUMENTS

| | | | |
|---|---|---|---|
| 6,023,179 | A | 2/2000 | Klass |
| 6,882,570 | B2 | 4/2005 | Byeon et al. |
| 7,915,925 | B2 | 3/2011 | Cong |
| 8,674,244 | B2 | 3/2014 | Kim et al. |
| 8,866,528 | B2 | 10/2014 | Lin et al. |
| 9,276,574 | B2 | 3/2016 | Lee et al. |
| 9,536,031 | B2 | 1/2017 | Liao et al. |
| 9,665,160 | B1 * | 5/2017 | Cao .................. G06F 1/324 |
| 2003/0145264 | A1 | 7/2003 | Siegel et al. |
| 2008/0253180 | A1 | 10/2008 | Nicolaidis et al. |
| 2008/0284480 | A1 | 11/2008 | Ahmadi |
| 2012/0087420 | A1 | 4/2012 | Kim |
| 2013/0057329 | A1 | 3/2013 | Tiwari et al. |
| 2013/0154709 | A1 | 6/2013 | Huang |
| 2013/0241617 | A1 | 9/2013 | Kim |

* cited by examiner

SYSTEM AND METHOD FOR IMPROVING SCAN HOLD-TIME VIOLATION AND LOW VOLTAGE OPERATION IN SEQUENTIAL CIRCUIT

CROSS-REFERENCE TO RELATED APPLICATION

This application claims priority under 35 U.S.C. § 119 to Provisional Patent Application Ser. No. 62/511,321, entitled "SYSTEM AND METHOD FOR IMPROVING SCAN HOLD-TIME VIOLATION AND LOW VOLTAGE OPERATION IN SEQUENTIAL CIRCUIT" filed on May 25, 2017. The subject matter of this earlier filed application is hereby incorporated by reference.

TECHNICAL FIELD

The present disclosure is generally related to circuits. In particular, the present disclosure relates to a system and method for improving scan hold-time violation and low voltage operation in a sequential circuit.

BACKGROUND

In electronics, a flip-flop or a latch is a circuit that has two stable states and can be used to store state information. A flip-flop changes state by signals applied to one or more control inputs and has one or two outputs. A flip-flop is the basic storage element in sequential logic. Flip-flops and latches are fundamental building blocks of digital electronics systems used in computers, communications, and many other types of systems.

Flip-flops and latches are used as data storage elements. A flip-flop stores a single bit (binary digit) of data; one of its two states represents a "one" and the other represents a "zero". Such data storage can be used for storage of state, and such a circuit is described as sequential logic.

Flip-flops can be either simple (transparent or opaque) or clocked (synchronous or edge-triggered). Although the term flip-flop has historically referred generically to both simple and clocked circuits, in modern usage it is common to reserve the term flip-flop exclusively for discussing clocked circuits; the simple ones are commonly called latches. Using this terminology, a latch is level-sensitive, whereas a flip-flop is edge-sensitive. That is, when a latch is enabled it becomes transparent, while a flip flop's output only changes on a single type (positive going or negative going) of clock edge.

Hold time is defined as the minimum amount of time after the clock's active edge during which data must be stable. Similar to setup time, each sequential element needs some time for data to remain stable after clock edge arrives to reliably capture data. This duration is known as hold time.

The data that was launched at the current edge should not travel to the capturing flop before hold time has passed after the clock edge. Adherence to hold time ensures that the data launched at current clock edge does not get captured at the same edge. In other words, hold time adherence ensures that system does not deviate from the current state and go into an invalid state.

SUMMARY

According to one general aspect, an apparatus may include a flip-flop circuit. The flip-flop circuit may include a selection circuit, a memory element circuit, a clock circuit. The selection circuit to select, as the selected input signal, between at least two input signals. The memory element circuit synchronously controlled by a clock signal, and configured to store the selected input signal. The clock circuit configured to output, at least, an earlier version of the clock signal and a later version of the clock signal. The selection circuit is configured to be synchronously controlled, at least in part, by the earlier version of the clock signal such that the selected input signal is held stable when being read by the memory element circuit.

According to another general aspect, an apparatus may include a memory element circuit synchronously controlled by a clock signal, and configured to store an input signal. The memory element may include a master portion configured to store the input signal during a first phase of the clock signal. The memory circuit may include a slave portion configured to, during a second phase of the clock signal, copy an inverted input signal from the master portion. The memory circuit may include a non-inverting enable circuit configured to: prevent inadvertent copying of the inverted input signal from the master portion to the slave portion, and supply the slave portion with the inverted input signal.

According to another general aspect, an apparatus may include a clock circuit, a selection circuit, and a memory element. The clock circuit configured to output, at least, an earlier version of a clock signal and a later version of the clock signal. The selection circuit may be configured to: select, as the selected input signal, between at least two input signals, and be synchronized, at least in part, by the earlier version of the clock signal such that the selected input signal is held stable when being read by a memory element circuit. The memory element circuit may be synchronously controlled by the clock signal, and configured to store the selected input signal. The memory element may include a master portion configured to store the selected input signal during a first semi-period of the clock signal. The memory element may include a slave portion configured to, during a second semi-period of the clock signal, copy an inverted, selected input signal from the master portion. The memory element may include a non-inverting enable circuit configured to: prevent inadvertent copying of the inverted input signal from the master portion to the slave portion, and supply the slave portion with the inverted input signal.

The details of one or more implementations are set forth in the accompanying drawings and the description below. Other features will be apparent from the description and drawings, and from the claims.

A system and/or method for a system and method for improving scan hold-time violation and low voltage operation in sequential circuit, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
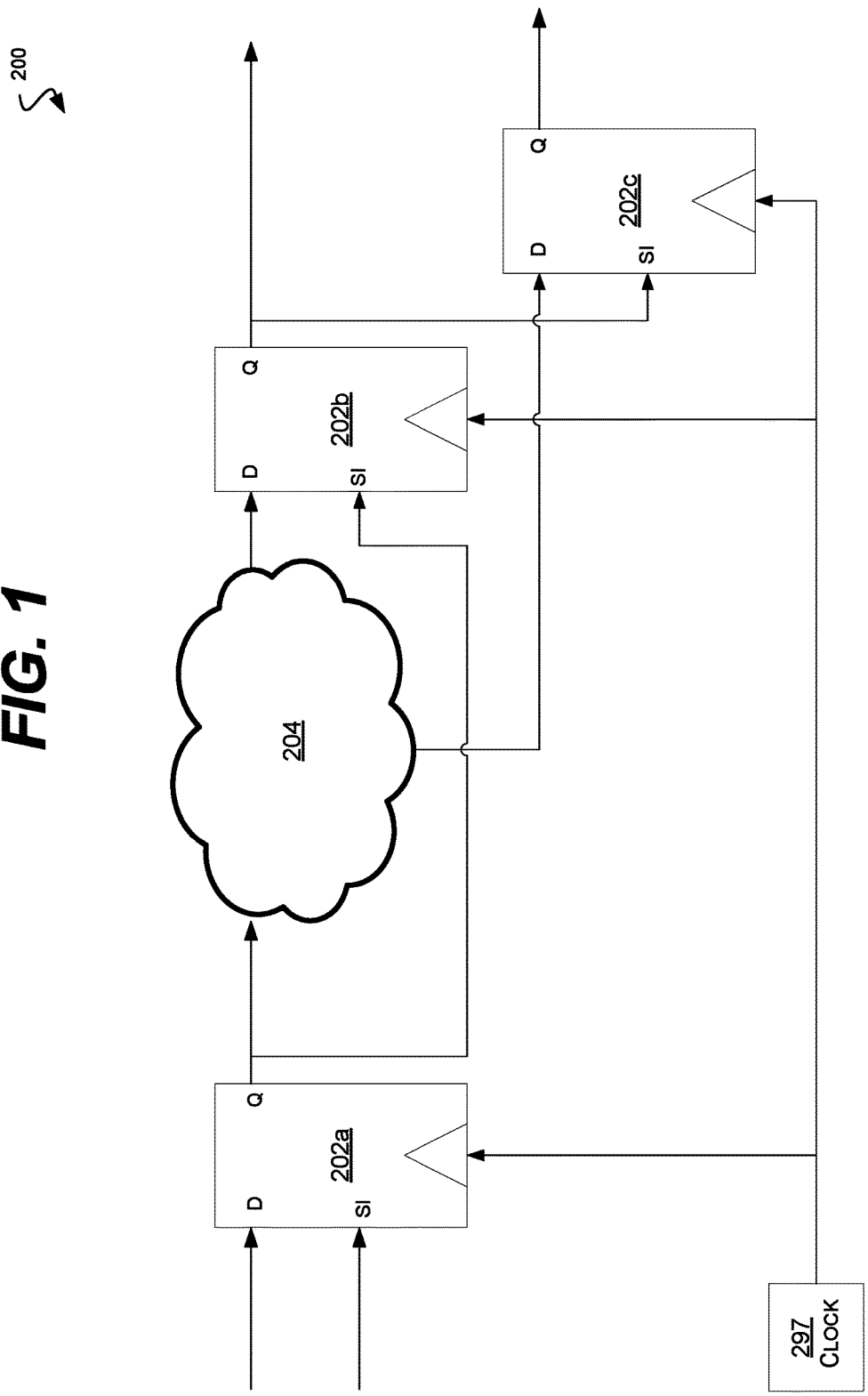
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 200 in accordance with the disclosed subject matter. In the illustrated embodiment, the system 200 may include a detailed view of a section of a larger scan chain.

In the illustrated embodiment, the system 200 may include a number of flip-flops (e.g., flipflops 202a, 202b, and 202c). The flip-flops 202 may be controlled or synchronized by a clock signal 297. The system 200 may also include a plurality of logic circuits 204. In the illustrated embodiment, the flip-flops 202a and 202c may store the inputs and outputs, respectively, of logic circuits 204.

Each flip-flop may include a D input port for, during normal operation, writing new data into the flip-flop, and a Q output port for reading the stored data from the flip-flop. Furthermore, each flip-flop may include a scan-in (SI) input port that, when in scan chain mode, writes new data into the flip-flop. It is understood that the above is merely one illustrative example to which the disclosed subject matter is not limited.

During normal operation, data is transmitted from the Q port of a first flip-flop (e.g., flip-flop 202a), through the logic circuits 204, and to the D input ports of a second and third flip-flops (e.g., flip-flops 202b and 202c). In such an embodiment, it takes time to go through the logic circuits 204. Generally, this time period is sufficient to meet any hold timing requirements of the flip-flops.

Conversely, when the system 200 is in scan mode, the logic circuits 204 may be bypassed, as the data is shifted along the scan chain. In such an embodiment, the data is transmitted from the Q port of a first flip-flop (e.g., flip-flop 202a), directly to the SI input port of a second flip-flop (e.g., flip-flop 202b), and then to the SI input port of the next flip-flop in the scan chain (e.g., flip-flop 202c). Because there are no (or very few) circuits between the flip-flops, in scan mode, the delay between the two flip-flops is often very small. In various embodiments, the delay may be small enough to violate the hold time requirements of the flip-flops. This may cause data corruption.

Often, the solution is to insert delay circuits (not shown) into the system. Such delay circuits cost power and area within the circuit. Occasionally these delay circuits are integrated into the flip-flops themselves. For example, a series of inverters may be added before the input portion of the SI port. When a common or uniform design scheme is used through out the chip, these extra delay circuits are often added to every flip-flop regardless of whether they are needed for that particular flip-flop or not.

Figure 2:
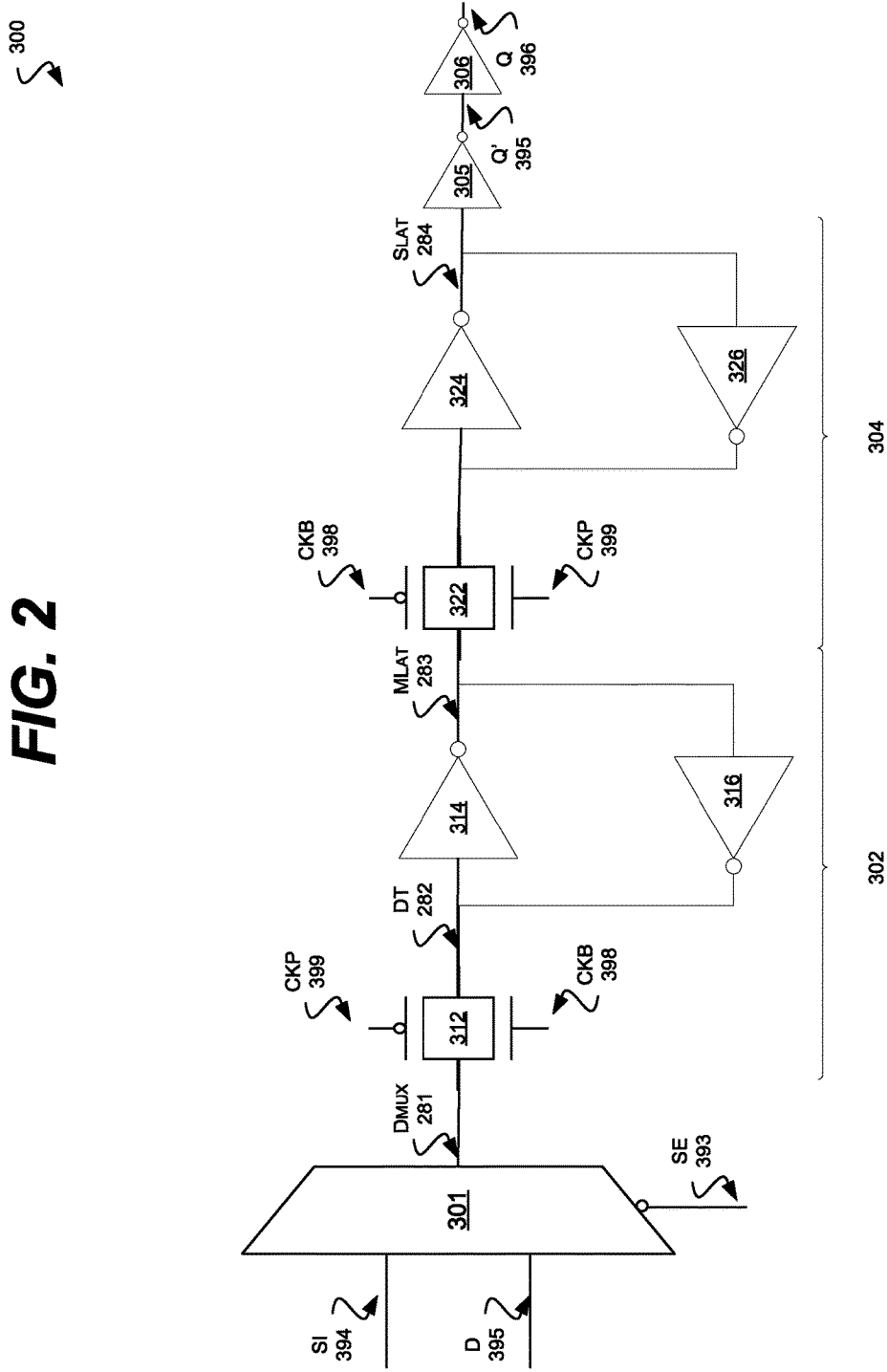
FIG. 2 is a block diagram of an example embodiment of a system in accordance with the disclosed subject matter.

FIG. 2 is a block diagram of an example embodiment of a circuit 300 in accordance with the disclosed subject matter. In various embodiments, the circuit 300 may include a flip-flop with integrated scan functionality. Further, in the illustrated embodiment, the circuit 300 may be configured to prevent or avoid hold time violations experienced in traditional flip-flop designs.

In such an embodiment, the circuit 300 may include a selection circuit or multiplexer (MUX) 302, a memory element circuit (portions 302 and 304), and inverters 305 and 306. In the illustrated embodiment, the memory element may include a master portion 302 and a slave portion 304. It is understood that the above is merely one illustrative example to which the disclosed subject matter is not limited.

Figure 3:
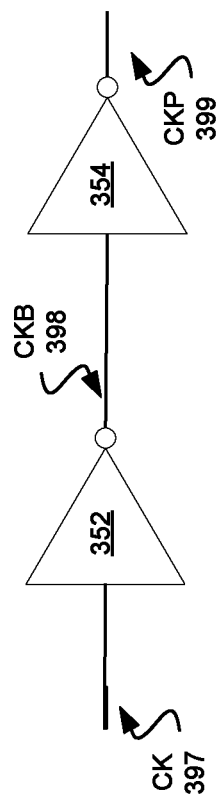
FIG. 3 is a block diagram of an example embodiment of a circuit in accordance with the disclosed subject matter.

FIG. 3 is a block diagram of an example embodiment of a circuit 350 in accordance with the disclosed subject matter. As described above, the circuit 300 may be controlled by a clock signal 397. Circuit 350 shows how the clock signal 397 may be processed for internal use by the circuit 300.

In the illustrated embodiment, the clock signal 397 may generate two derivative clock signals CKB 398 and CKP 399. In such an embodiment, the circuit 350 may include two inverters 352 and 354 connected in series. This may be done, in part, to clean the clock signal 397 (e.g., restore the voltage to a common voltage level).

In such an embodiment, the earlier clock signal CKB 398 may be generated by the inverter 352 and may be the inverse of the earliest clock signal 397. The later clock signal CKP 399 may be generated by the inverter 354. The clock signals 398 and 399 are delayed (and in the case of clock 398, inverted) versions of the clock signal 397.

Returning to FIG. 2, the clock signals CKB 398 and CKP 399 may be employed to control particular parts of the circuit 300.

In the illustrated embodiment, the selection circuit 301 may select between the normal operational input D 395 and the scan chain input SI 394. This may be done based on the scan enable signal SE 393. The selection circuit 302 may generate a selected input signal DMux 281.

The selected input signal DMux 281 may be presented to the master portion 302. The master portion 302 may include a pass or transmission gate 312, and two feedback inverters 314 and 316. If the selected input signal DMux 281 changes before the later clock signal CKP 399 stabilizes to a high value (closing the pass-gate 312), a hold failure occurs, and the master portion 302 stores a wrong value.

Regardless of whether a hold failure occurred, the selected input DMux 281 (as DT 282) is then stored in the feedback inverters 314 and 316, and output from the master portion 302 as master output signal MLat 283.

The slave portion 304 may include a pass-gate 322, and two feedback inverters 324 and 326. Once the pass-gate 322 opens, the signal MLat 283 is stored in the feedback inverters 324 and 326, and the signal SLat 284 is output.

In the illustrated embodiment, the output of the slave portion 304 may be passed through two inverters 305 and 306. The inverter 305 may output the Q output signal 395 and the inverter 306 may output the Q output signal 396. In some embodiments, only a single inverter may be employed. In which case the output would be the inverse of Q 396 or QN. It is understood that the above are merely a few illustrative examples to which the disclosed subject matter is not limited.

As described above, if the selected input signal DMux 281 changes before the later clock signal CKP 399 stabilizes to a high value, the changing DMux 281 may inadvertently shoot through the pass-gate 312. In the illustrated embodiment, this may be prevented by powering the selection circuit 301, not with the core voltage Vdd, but by the earlier clock signal CKB 398. In the illustrated embodiment, the master and slave portions 302 and 304, and other circuits 305 and 306 may remain powered by the core voltage Vdd (shown in FIG. 4).

In such an embodiment, if, for example, the scan pin SI 394 falls before the later clock signal CKP 399 rises (turning off the pass-gate 312), DMux 281 cannot be pulled high to Vdd because the earlier clock signal CKB 398 has fallen (turning off the selection circuit 301). As a result, the master portion 302 cannot be corrupted and a hold failure cannot occur. In the illustrated embodiment, this requires no additional delay circuitry, as is traditionally employed.

In the illustrated embodiment, the input signals (e.g., D 395, scan pin SI 394) only have to be held until the first or earlier clock signal CKB 398 has settled. Therefore, the hold time required for the SI signal 394 and D 395 and circuit 300 is lowered (compared to the traditional circuit). The scan pin SI 394 is significantly less susceptible to hold failure (compared to the traditional flip-flop) and the of typical scan chain configuration, discussed earlier, becomes less error prone with no additional circuity (e.g., delay circuits).

Figure 4:
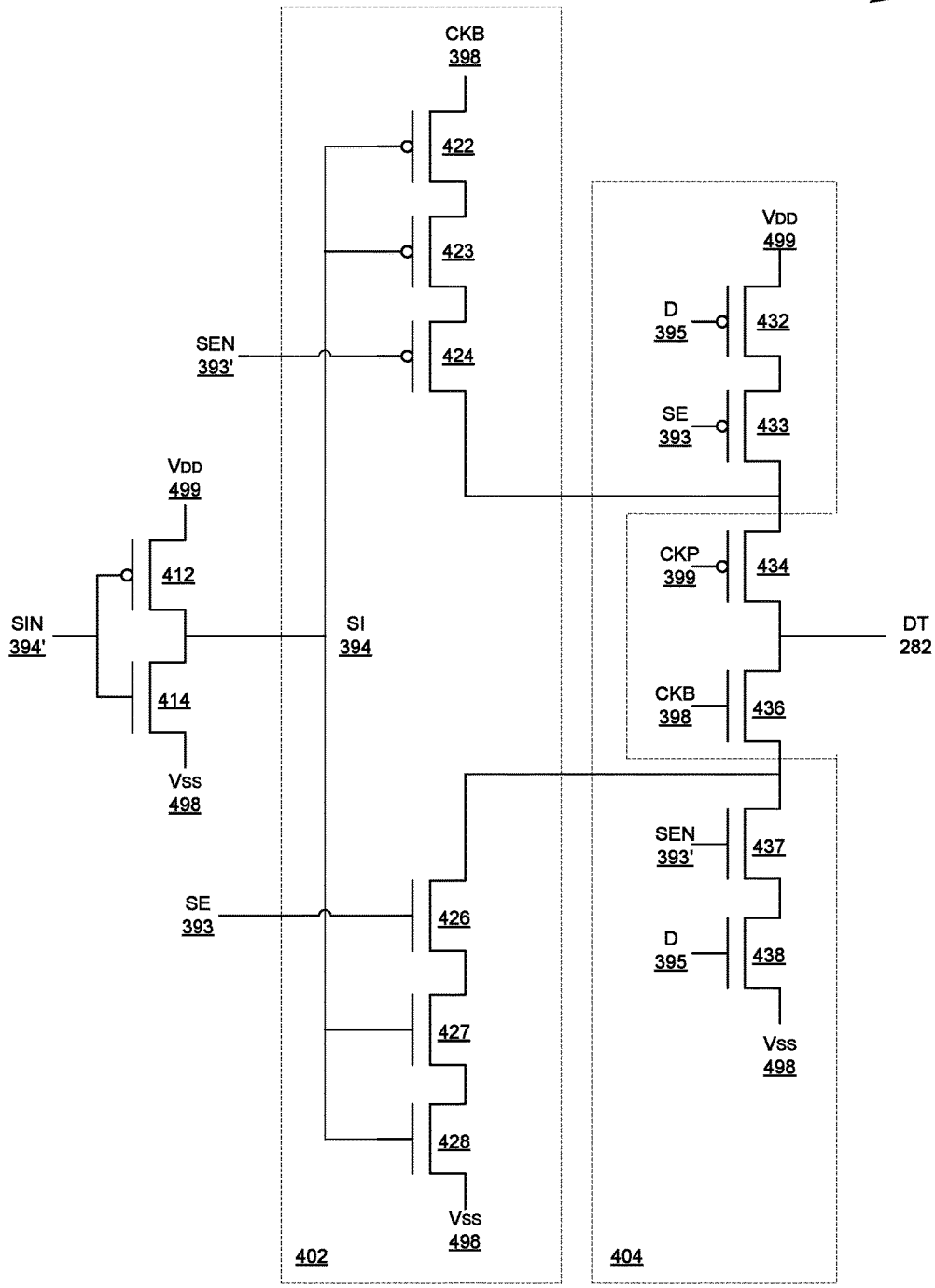
FIG. 4 is a block diagram of an example embodiment of a circuit in accordance with the disclosed subject matter.

FIG. 4 is a block diagram of an example embodiment of a circuit 400 in accordance with the disclosed subject matter. In various embodiments, the circuit 400 may include the selection circuit and master portion's pass-gate of FIG. 2.

In the illustrated embodiment, the circuit 400 may include the P-type metal-oxide-semiconductor (PMOS) transistors 412, 422, 423, 424, 432, 433, and 434. The circuit 400 may include the N-type metal-oxide-semiconductor (NMOS) transistors 414, 426, 427, 428, 436, 437, and 438. The circuit 400 may include a dynamic signal portion 402 in which a respective high voltage is provided by the earlier clock signal CKB 398, and a static signal portion 404 in which a respective static voltage is provided by a common voltage Vdd 499.

In the illustrated embodiment, the transistors 412 and 414 may be arranged to invert the input signal SIN 394', which is an inverted version of the signal SI 394, discussed above. The transistors 412 and 414 may have a high voltage of Vdd 499 and a low voltage of Vss 498.

The transistors 422, 423, and 424 may be coupled in series and may be part of the dynamic signal portion 402. The transistors 422, 423, and 424 may be coupled between a high voltage and the transistor 434. In the illustrated embodiment, the high voltage for the transistors 422, 423, and 424 may be the earlier clock signal CKB 398. As a changing clock signal, the power is said to be dynamic. Transistors 422 and 423 may take the signal SI 394 as input. Whereas the transistor 424 may use the inverse of the scan enable signal SEN 393' as input.

The transistors 426, 427, and 428 may be coupled in series and may be part of the dynamic signal portion 402. The transistors 426, 427, and 428 may be coupled between the transistor 436 and the low voltage Vss 498. Transistors 427 and 428 may take the signal SI 394 as input. The transistor 426 may use the un-inverted scan enable signal SE 393 as input.

The transistors 432, 433, and 434 may be coupled in series. The transistors 432, 433, and 434 may be coupled between the high voltage Vdd 499 and the transistor 436. In the illustrated embodiment, the high voltage for the transistors 422, 423, and 424 may be the high voltage Vdd 499. As an unchanging core power signal, the power or high voltage is said to be static. The transistors 432, and 433 may be part of the static signal portion 404. Transistor 432 may take the signal D 395 as input. Transistor 433 may take the scan enable signal SE 393 as input.

The transistors 436, 437, and 438 may be coupled in series. The transistors 436, 437, and 438 may be coupled between the low voltage Vss 498 and the transistor 434. The transistors 437 and 438 may be part of the static signal portion 404. Transistor 438 may take the signal D 395 as input. Transistor 437 may take the inverted scan enable signal SEN 393' as input.

In the illustrated embodiment, the transistors 434 and 434 may be the pass-gate of the master portion of the memory element circuit, as described above. In the illustrated embodiment, the transistor 434 may receive the later clock signal CKP 399 as input. The transistor 436 may receive the earlier clock signal CKB 398 as input. The transistors 434 and 436 may output the signal DT 282.

In the illustrated embodiment, the scan pin signal (shown as inverted SIN 394') only has to be held until the earlier clock CKB 398 has settled. Therefore, the hold time required by the flip-flop is lowered. The scan pin signal (SI 394) is significantly less susceptible to hold fail because of typical scan chain configuration discussed earlier. Now, if the scan pin signal (SI 394) falls before the later clock signal CKP 399 rises, DT 282 cannot be pulled high (hold corrupted) to Vdd 499 because the earlier clock signal CKB 398 falls before the later clock signal CKP 399 rises. So, the master latch portion cannot be hold corrupted. This requires no additional delay circuitry, as described above.

In such an embodiment, the rising hold time may be lowered by half (e.g., from 30 picoseconds (ps) to 15 picoseconds). It is understood that the above are merely a few illustrative examples to which the disclosed subject matter is not limited.

By not adding delay circuits or buffers, the disclosed subject matter allows the disclosed flip-flop to operate with a data path speed and amount of clock power consumption that are similar to the conventional master/slave (MS) flip-flop. The disclosed subject matter has a smaller area and lower power requirement that traditional delay circuits. It also nearly eliminates scan hold-time failures on the scan pin versus conventional master-slave flip-flops. It is understood that the above are merely a few illustrative examples to which the disclosed subject matter is not limited.

Figure 5A:
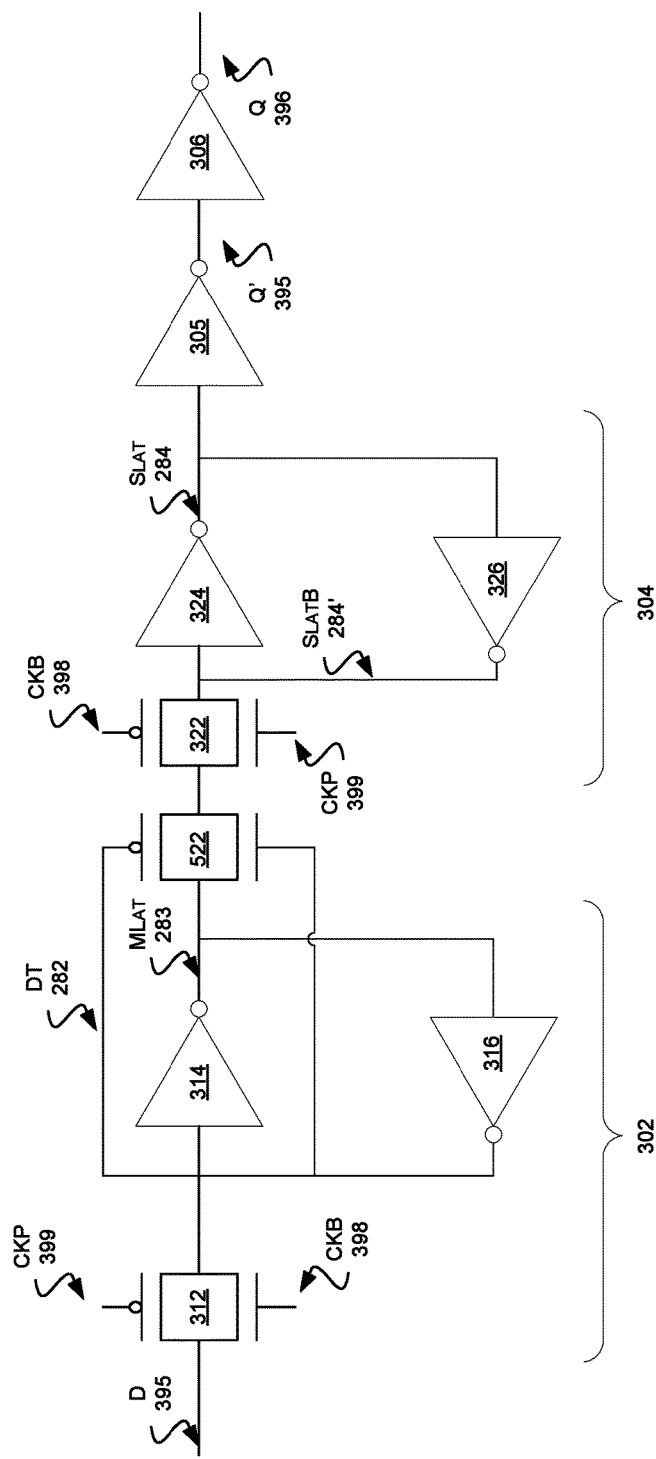
FIG. 5A is a block diagram of an example embodiment of a circuit in accordance with the disclosed subject matter.

FIG. 5A is a block diagram of an example embodiment of a circuit 500 in accordance with the disclosed subject matter. In the illustrated embodiment, the circuit 500 may include a flip-flop. In the illustrated embodiment, the circuit 500 does not receive a scan chain input, i.e., the only input is D 395. It is understood that the above is merely one illustrative example to which the disclosed subject matter is not limited.

In the illustrated embodiment, the circuit 500 may include the master portion 302 and the slave portion 304, as described above. In addition, the circuit 500 may include the inverters 305 and 306, as described above. Again, the master portion 302 may include the pass-gate 312 and the two feedback inverters 314 and 316, as described above. The slave portion 304 may include the pass-gate 322 and the two feedback inverters 324 and 326, as described above.

Pass-gates (e.g., pass-gate 322) become effectively transparent during clock switching. This is true especially if the clock signals 398 and 399 have large skews or transition times. This may be exacerbated by operation at low voltages.

In such an embodiment, the master and slave portions 302 and 304 may corrupt each other. This inadvertent or undesirable copying of values between the two portions 302 and 304, if it occurs, will cause computation errors in the CLBs that include the flip-flops. Traditionally, the fix for this has been to replace the slave pass-gate 322 with an enabled inverter. However, this increases delay and power consumption.

In the illustrated embodiment, an enabled pass-gate 522 is employed instead. The enabled pass-gate 522 is placed in-line between the master and slave portions 302 and 304. Also, unlike the master and slave pass-gates 312 and 322, which are controlled by the clock signals 398 and 399, the enabled pass-gate is controlled by the input signal DT 282.

A pass-gate (e.g., pass-gate 522) is traditionally created by coupling an NMOS and a PMOS transistor together, and coupling the gate signals to inverse versions of the same control signal. For example, the pass-gate 322 is coupled to the signals 398 and 399 which are ideally perfect inverse versions of each other. Of course, the timing of the signals 398 and 399 are not ideal, hence the corruption issues, but for purposes of explaining the pass-gates their less than ideal characteristics will be temporarily ignored. Because the controlling signals are inverse versions of each other, both the NMOS and PMOS turn on or off at the same time.

In the illustrated embodiment, instead of connecting the pass-gate 522 to two inverted or mirrored signals, both the NMOS and PMOS gates are coupled to the same signal DT 282. Therefore, only one half of the pass-gate will be "on", enabled, or transparent at a time.

In the illustrated embodiment and in a first example, D 395 and DT 282 are high, and MLat 283 is low. The SLat 284 may be low (SLatB 284' is high) from the previous clock cycle. The earlier clock signal CKB 298 may fall well before the later clock signal CKP 399 rises (e.g., due to skew or delay). As described above, this is a non-ideal timing characteristic.

The PMOS of the slave pass-gate 322 may be "on". While the NMOS of the slave pass-gate 322 may be "off". Traditionally (in an embodiment lacking the enabled pass-gate 522), this would allow the high value of SLatB 284' to be written back into the master 302. However, in the illustrated embodiment, the PMOS of the enabled pass-gate 522 would be "off" (as DT 282 is high). Therefore, the enabled pass-gate 522 would block the inadvertent or undesirable writing of the slave 304 to the master 302.

In a second example, D 395 and DT 282 are low, and MLat 283 is high. The SLat 284 may be high (SLatB 284' is low) from the previous clock cycle. The earlier clock signal CKB 298 may rise well before the later clock signal CKP 399 falls (e.g., due to skew or delay). As described above, this is a non-ideal timing characteristic.

The NMOS of the slave pass-gate 322 may be "on". While the PMOS of the slave pass-gate 322 may be "off". Traditionally (in an embodiment lacking the enabled pass-gate 522), this would allow the high value of MLat 283 to overwrite the slave's value. However, in the illustrated embodiment, the NMOS of the enabled pass-gate 522 would be "off" (as DT 282 is low). Therefore, the enabled pass-gate 522 would block the inadvertent or undesirable writing of the master 302 to the slave 304, when the clock signal (CK 397) falls. It is understood that the above are merely a few illustrative examples to which the disclosed subject matter is not limited.

In such an embodiment, the enabled pass-gate 522 may be configured to not-invert the signal MLat 283, as the traditional enabled inverter solution would. The enabled pass-gate 522 may also be configured to block or prevent an inadvertent copying of a signal between the master and slave portions 302 and 304, by assuring that, if copying is not desired, no more than one of the two PMOS transistors in pass-gates 522 & 322 are on at the same time, and no more than one of the two NMOS transistors in pass-gates 522 & 322 are on at the same time.

In various embodiments, the enabled pass-gate 522 allows the circuit 500 to operate with similar speed (CK 297 to Q 396) and power relative to comparable conventional pass-gate master/slave flip flops. In some embodiments, the circuit 500 may have essentially the same area as a conventional master/slave flip-flop with a pass-gate. In various embodiments, the enabled pass-gate may allow for dramatically improved low voltage operation, as the undesirable transmission of data between the master and slave portions 302 and 304 are avoided.

In various embodiments, compared to a traditional enabled-inverter master/slave flip-flop, the circuit 500 may: be ~10% faster, have 2-5% better area consumption, and, have comparable low voltage operation. In various embodiments, compared to a transmission-gate style master/slave flip-flop, the circuit 500 may: have comparable area to transmission-gate master-slave flip-flops, and have vastly improved low voltage operation.

In some embodiments, the amount of clock skew or delay that the enabled pass-gate 522 may compensate for, or may be able to prevent undesired copying during, may be determined by the manufacturing process or otherwise structurally defined. It is understood that the above are merely a few illustrative examples to which the disclosed subject matter is not limited.

Figure 5B:
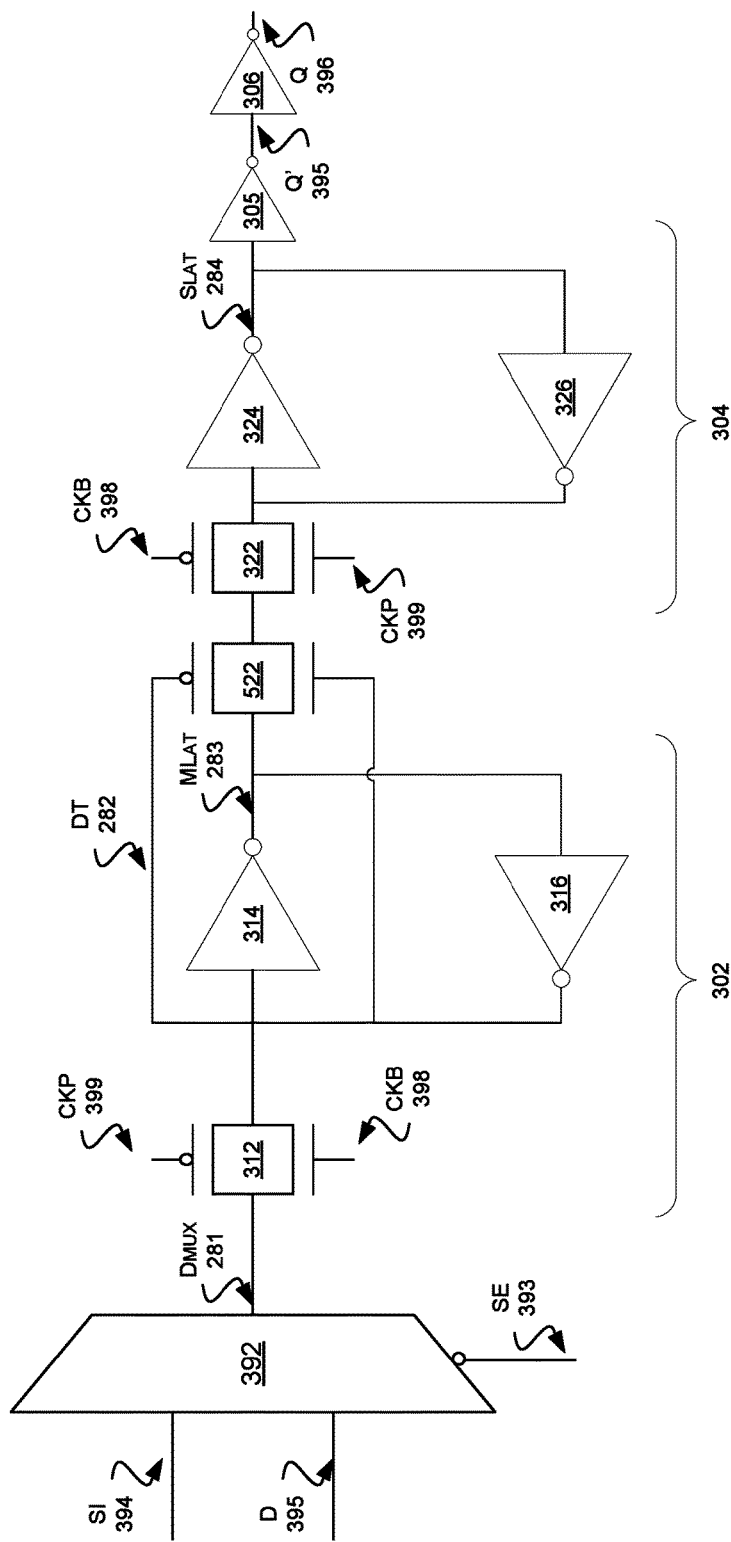
FIG. 5B is a block diagram of an example embodiment of a circuit in accordance with the disclosed subject matter.

FIG. 5B is a block diagram of an example embodiment of a circuit 501 in accordance with the disclosed subject matter. In the illustrated embodiment, the circuit 501 may include a flip-flop. In the illustrated embodiment, the circuit 501 may be scan enabled. It is understood that the above is merely one illustrative example to which the disclosed subject matter is not limited.

As described above, in the illustrated embodiment, the circuit 501 may include the master portion 302 and the slave portion 304, as described above. In addition, the circuit 501 may include the inverters 305 and 306, as described above. Again, the master portion 302 may include the pass-gate 312 and the two feedback inverters 314 and 316, as described above. The slave portion 304 may include the pass-gate 322 and the two feedback inverters 324 and 326, as described above. The circuit 501 may also include the enabled pass-gate 522, as described above.

In addition, the circuit 501 may include the selection circuit 392, as described above. In various embodiments, the selection circuit 392 may be powered by the core voltage Vdd (e.g., Vdd 499 of FIG. 4). In another embodiment, the selection circuit 392 may be powered by the earlier clock signal CKB 398, as described above.

Figure 6:
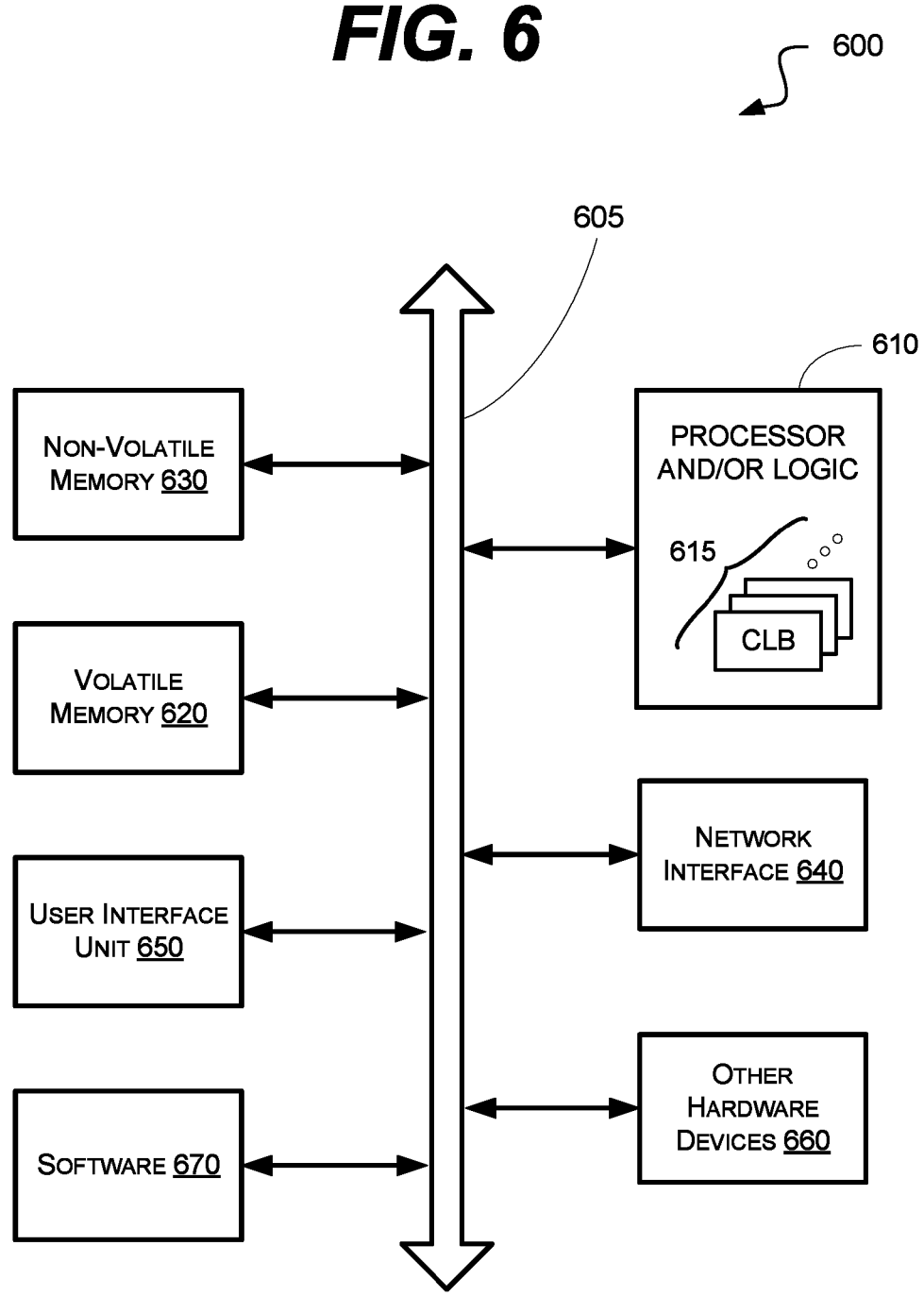
FIG. 6 is a schematic block diagram of an information processing system that may include devices formed according to principles of the disclosed subject matter.

FIG. 6 is a schematic block diagram of an information processing system 600, which may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM)). The information processing system 600 according to the disclosed subject matter may further include a non-volatile memory 630 (e.g., a hard drive, an optical memory, a NAND or Flash memory). In some embodiments, either the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form.

In various embodiments, the information processing system 600 may include one or more network interfaces 640 configured to allow the information processing system 600 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 600 according to the disclosed subject matter may further include a user interface unit 650 (e.g., a display adapter, a haptic interface, a human interface device). In various embodiments, this user interface unit 650 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640) of the information processing system 600. In such an embodiment, the information processing system 600 may include one or more native applications, which may be installed locally (e.g., within the non-volatile memory 630) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
    a flip-flop circuit, the flip-flop circuit comprising:
    a selection circuit to select a selected input signal between at least two input signals;
    a memory element circuit synchronously controlled by a clock signal, and configured to store the selected input signal;
    a clock circuit configured to output, at least, an earlier version of the clock signal and a later version of the clock signal; and
    wherein the selection circuit is configured to be powered, at least in part, by the earlier version of the clock signal such that the selected input signal is held stable when being read by the memory element circuit.

2. The apparatus of claim 1, wherein the first input signal is the output of a combinatorial logic circuit, and the second input signal is part of a scan chain.

3. The apparatus of claim 1, wherein, to meet a hold timing requirement of the memory element circuit, the second input signal is held until the earlier clock signal has stabilized.

4. The apparatus of claim 1, wherein the memory element circuit comprises:
    a first part that is writable in accordance with the earlier clock signal; and
    a second part that is writable in accordance with the later clock signal.

5. The apparatus of claim 1, wherein the memory element circuit and the clock circuit are both powered by a common voltage signal;

wherein the earlier version of the clock signal and the common voltage both include a substantially same high voltage, but include different timing characteristics.

6. The apparatus of claim 1, wherein the apparatus is configured to store the selected signal based upon a rising edge of the clock signal.

7. The apparatus of claim 1, wherein the selection circuit comprises:

a dynamic signal portion in which a respective high voltage is provided by the earlier clock signal, and a static signal portion in which a respective high voltage is provided by a common voltage.

8. An apparatus comprising:

a memory element circuit synchronously controlled by a clock signal, and configured to store an input signal;

wherein the memory element circuit comprises:

a master portion configured to store the input signal during a first phase of the clock signal, a slave portion configured to, during a second phase of the clock signal, copy an inverted input signal from the master portion, and a non-inverting enable circuit configured to:

prevent inadvertent copying of the inverted input signal from the master portion to the slave portion during clock transition, and supply the slave portion with the inverted input signal.

9. The apparatus of claim 8, wherein the non-inverting enable circuit comprises a pass-gate.

10. The apparatus of claim 9, wherein the non-inverting enable circuit is enabled by the input signal.

11. The apparatus of claim 10, wherein the slave portion of the memory element circuit includes a pass-gate enabled by the clock signal and is configured to receive the inverted input signal.

12. The apparatus of claim 11, wherein the pass-gate of the non-inverting enable circuit comprises a first PMOS transistor and a first NMOS transistor;

wherein the pass-gate of the slave portion of the memory element circuit comprises a second PMOS transistor and a second NMOS transistor; and wherein the non-inverting enable circuit is configured to, if copying is not desired, assure that:

no more than one of the first or second PMOS transistors is on, and no more than one of the first or second NMOS transistors is on.

13. The apparatus of claim 8, wherein non-inverting enable circuit is configured to prevent inadvertent copying of the inverted input signal from the slave portion to the master portion.

14. The apparatus of claim 8, wherein the apparatus comprises a clock circuit configured to output, at least, an earlier version of the clock signal and a later version of the clock signal; and wherein the non-inverting enable circuit is configured to prevent copying of the inverted input signal between the master portion and the slave portion during clock transition when an amount of clock skew between the earlier version of the clock signal and the later version of the clock signal is higher than a structurally defined value.

15. An apparatus comprising:

a clock circuit configured to output, at least, an earlier version of a clock signal and a later version of the clock signal; and a selection circuit configured to:

select a selected input signal between at least two input signals, and be powered, at least in part, by the earlier version of the clock signal such that the selected input signal is held stable when being read by a memory element circuit, wherein:

the memory element circuit is synchronously controlled by the clock signal, and configured to store the selected input signal; and the memory element circuit comprises:

a master portion configured to store the selected input signal during a first semi-period of the clock signal, a slave portion configured to, during a second semi-period of the clock signal, copy an inverted, selected input signal from the master portion, and a non-inverting enable circuit configured to:

prevent inadvertent copying of the inverted input signal from the master portion to the slave portion, and supply the slave portion with the inverted input signal.

16. The apparatus of claim 15, wherein, to meet a hold timing requirement of the memory element circuit, the second input signal is held until the earlier clock signal has stabilized.

17. The apparatus of claim 15, wherein the memory element circuit and the clock circuit are both powered by a common voltage signal;

wherein the earlier version of the clock signal and the common voltage both include a substantially same high voltage, wherein the common voltage is substantially static over time, and wherein the earlier version of the clock signal changes voltage over time.

18. The apparatus of claim 15, wherein the selection circuit comprises:

a dynamic signal portion in which a respective high voltage is provided by the earlier clock signal, and a static signal portion in which a respective high voltage is provided by a common voltage.

19. The apparatus of claim 15, wherein the non-inverting enable circuit is configured to prevent copying of the inverted input signal between the master portion and the slave portion during clock transition when an amount of clock skew between the earlier version of the clock signal and the later version of the clock signal is higher than a structurally defined value.

20. The apparatus of claim 15, wherein the non-inverting enable circuit comprises a pass-gate that comprises a first PMOS transistor and a first NMOS transistor;

wherein the slave portion of the memory element circuit comprises a pass-gate that comprises a second PMOS transistor and a second NMOS transistor; and wherein the non-inverting enable circuit is configured to, if copying is not desired, assure that:

no more than one of the first or second PMOS transistors is on, and no more than one of the first or second NMOS transistors is on.

* * * * *